(12) United States Patent
Kim

(10) Patent No.: US 6,696,851 B2
(45) Date of Patent: Feb. 24, 2004

(54) RECEPTION LINE BREAK DETECTION APPARATUS

(75) Inventor: Seon-O Kim, Suwon (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/155,126

(22) Filed: May 28, 2002

(65) Prior Publication Data

US 2003/0132780 A1 Jul. 17, 2003

(30) Foreign Application Priority Data

Jan. 12, 2002 (KR) .......................................... 2002-1851

(51) Int. Cl.$^7$ ............................................ H03K 19/007
(52) U.S. Cl. ............................. 326/14; 326/9; 326/130; 326/136
(58) Field of Search ................................ 326/9, 14, 15, 326/130, 131

(56) References Cited

U.S. PATENT DOCUMENTS

| | | | |
|---|---|---|---|
| 6,014,322 A | * | 1/2000 | Higashi et al. ................ 363/65 |
| 6,052,061 A | * | 4/2000 | Yamauchi .............. 340/825.16 |
| 6,275,062 B1 | | 8/2001 | Starr |

* cited by examiner

*Primary Examiner*—Anh Tran
(74) *Attorney, Agent, or Firm*—Staas & Halsey LLP

(57) ABSTRACT

A reception line break detection apparatus includes a transmission-side line drive, a reception line, a switching element, and a reception-side line receiver receiving signals transmitted from the transmission-side line drive through the reception line. The apparatus further includes a break detection unit detecting a break of the reception line using the switching element, where the switching element is switched according to a line voltage of lead-in wires branched off from the reception line. Accordingly, the apparatus includes fewer components than conventional apparatuses and fewer power sources are required.

13 Claims, 3 Drawing Sheets

RECEPTION LINE BREAK DETECTION APPARATUS

CROSS-REFERENCE TO RELATED APPLICATIONS

This application claims the benefit of Korean Application No. 2002-1851, filed Jan. 12, 2002, in the Korean Patent Office, the disclosure of which is incorporated herein by reference.

BACKGROUND OF THE INVENTION

1. Field of the Invention

The present invention relates to a reception line break detection apparatus, which is insulated with ease and allows a reduced number of component parts and power sources.

2. Description of the Related Art

In general, data transmission apparatuses are used to transmit data from transmission sides to reception sides. A line drive for the transmission side and a line receiver for the reception side are employed in the data transmission apparatus. The line drive and the line receiver are connected to each other via transmission lines, each including two strands so as to receive and transmit data.

FIG. 1 is a diagram showing a conventional reception line break detection apparatus applied to a motor control system, where data is transmitted and received through three channels CH1, CH2, and CH3. Signals outputted through a line drive 1 in a transmission side are transmitted through transmission lines of the channels, and the signals are received by a line receiver 4 in a reception side through terminating circuits 3. Meanwhile, the reception side is equipped with a plurality of potentiometers 2 and an OR gate 5 so as to detect breaks of reception lines on the reception sides.

Each of the potentiometers 2 outputs an error signal FAULT indicating a break of a reception line when a potential difference of the reception line, that is, whether a voltage of the reception line (hereinafter, referred to as a "line voltage"), deviates from a standard voltage (prescribed by an international standards organization). The error signal is provided to each of the channels. When the OR gate 5 receives an error signal FAULT from any of the potentiometers 2, the OR gate 5 outputs a break detection signal to a receiver controller to notify the receiver controller of an occurrence of a line break on the reception side.

Referring to FIG. 2, the potentiometer 2 is provided for each of the reception lines connected to the channels CH1, CH2, and CH3 extending from the line drive 1, connected to two lead-in wires branched off from each of the reception lines, including a plurality of resistors R1 to R8, three comparators C1 to C3 and an OR gate, and three kinds of power sources VCC, VEE, and GND.

The comparator C1 differentially amplifies the lead-in voltages IN+ and IN−, and outputs the amplified voltages to a positive terminal of the comparator C2 and a negative terminal of the comparator C3. The comparator C2 compares the amplified voltage with a reference voltage −0.6 V inputted to a negative terminal of the comparator C2, and outputs a detection signal if this amplified voltage is lower than this reference voltage. The comparator C3 compares the amplified voltage with a reference voltage +0.6 V inputted to a positive terminal of the comparator C3, and outputs the detection signal if this amplified voltage is lower than this reference voltage. As a result, the OR gate outputs the error signal FAULT to the receiver controller when the detection signal is inputted to the OR gate from any of the two comparators C2 and C3. The signals differentially amplified in the comparator C1 are compared with reference voltages by two comparators C2 and C3 so as to detect line breaks for all the signals inputted normally or in reverse because the lead-in wire voltages IN+ and IN− can be applied normally or in reverse.

In the conventional reception line break detection apparatus, a potential difference and a reference voltage 0.6 V must be precisely compared with each other so as to ensure reliability of the detection operation of the apparatus. To this end, a plurality of component parts such as resistors and comparators are employed, so the manufacturing costs of the conventional reception line break detection apparatus are high. Additionally, three different types of power sources are used, so it is difficult to insulate the apparatus.

SUMMARY OF THE INVENTION

Accordingly, the present invention has been made keeping in mind the above problems occurring in the conventional art, and an object of the present invention is to provide a reception line break detection apparatus including a relatively small number of component parts, which can be easily insulated due to a reduction in a number of power sources.

In order to accomplish the above and other objects, the present invention provides a reception line break detection apparatus, including: a transmission-side line drive; a reception line; a switching element; a reception-side line receiver receiving signals transmitted from the transmission-side line drive through the reception line; and a break detection unit detecting a break of the reception line using the switching element, wherein the switching element is switched according to a line voltage of lead-in wires branched off from the reception line.

To achieve the above and other objects, the present invention provides a reception line break detection apparatus transmitting and receiving data, including: a transmission-side line drive transmitting signals; a reception-side line receiver receiving the signals; a reception line electrically coupling the transmission-side line drive to the reception-side line receiver; and a break detection unit including an input side connected to the reception line and an output side insulated from the reception line, wherein the break detection unit detects a line break of the reception line when a line voltage of the reception line is lower than a reference voltage and outputs an error signal indicative thereof.

These together with other objects and advantages, which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
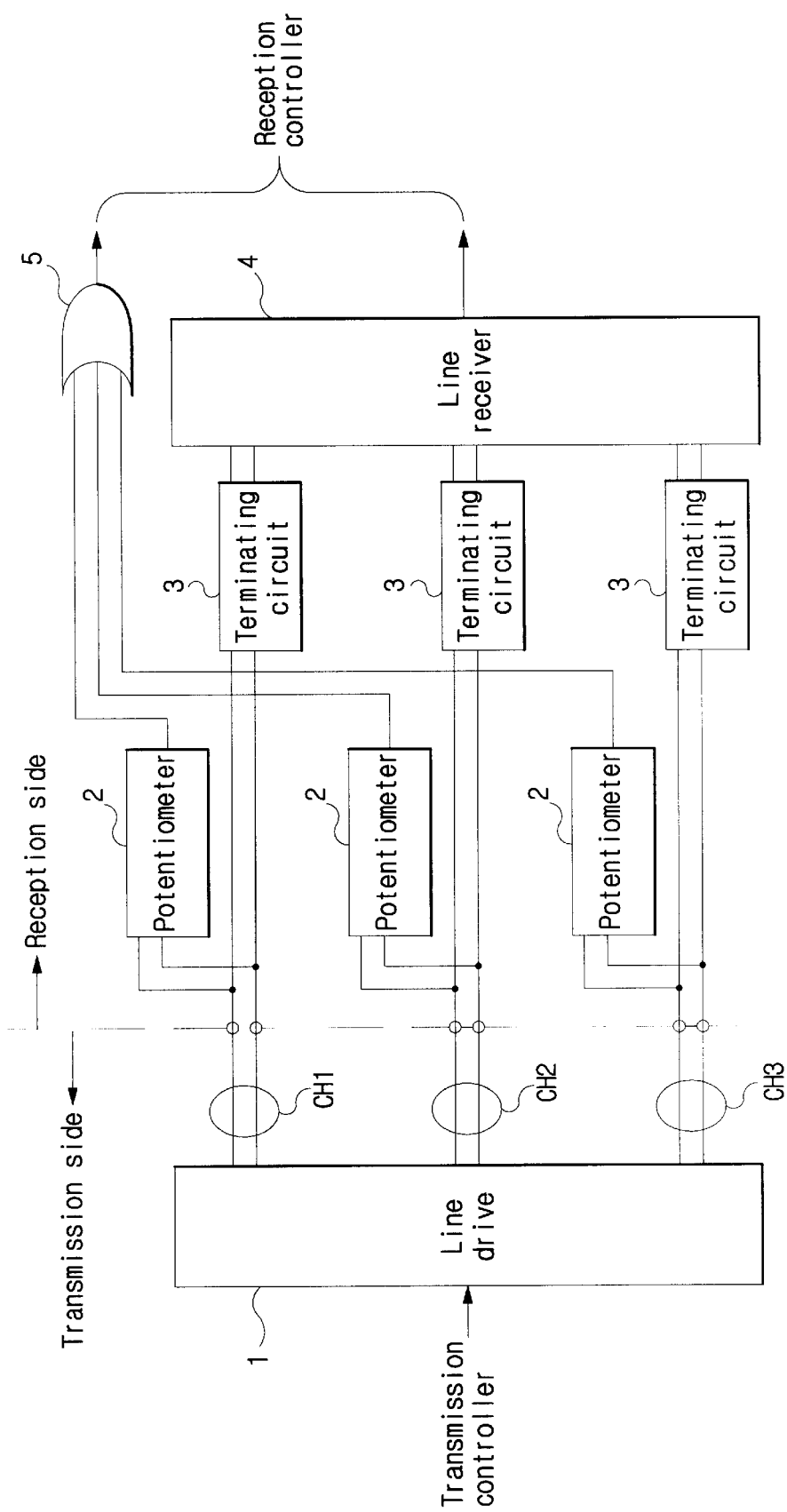
FIG. 1 is a diagram showing a conventional reception line break detection apparatus.
Figure 2:
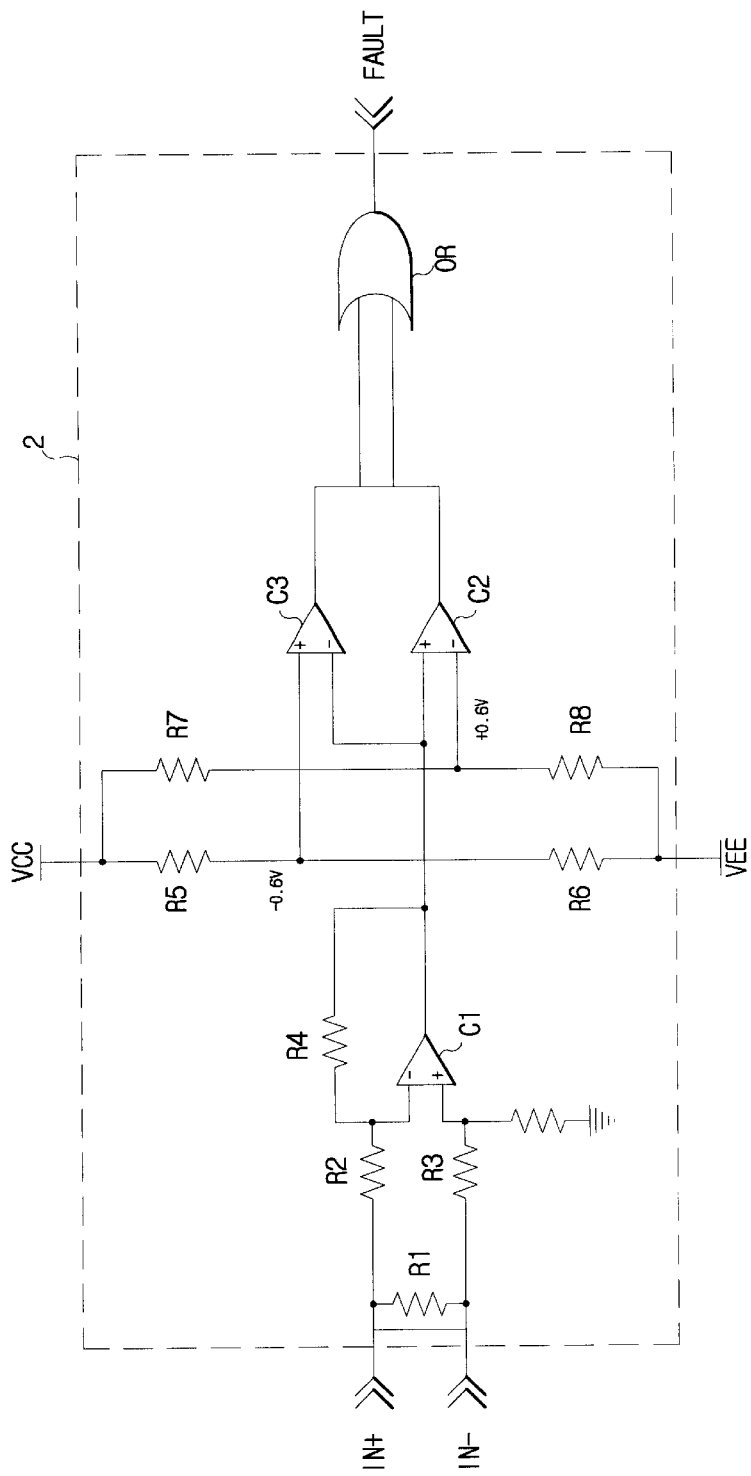
FIG. 2 is a circuit diagram of a conventional potentiometer.

The present invention is applicable to an apparatus to transmit and receive data using a transmission-side line drive and a reception-side line receiver, respectively. A reception line break detection apparatus of the present invention includes component parts, which are identical with those of the apparatus of FIG. 1 except that the potentiometer 2 of FIG. 1 is replaced with a break detection unit 6, to be later described. The break detection unit 6 includes fewer components than the potentiometer 2 in the conventional reception line break detection apparatus and fewer power supplies.

The present invention provides for a switching element to detect a break of a reception line, which electrically couples the transmission-side line drive and the reception-side line receiver. A line voltage is used to detect the break and a bi-directional photocoupler is employed as the switching element.

Figure 3:
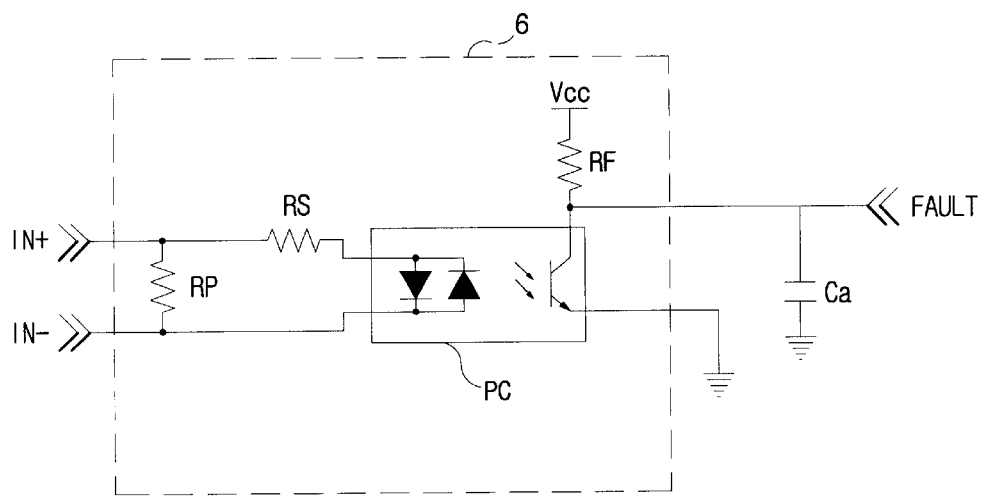
FIG. 3 is a circuit diagram showing a break detection unit applied to a reception line break detection apparatus, in accordance with the present invention.

Referring to FIG. 3, the break detection unit 6 includes a terminating resistor RP connected across lead-in wires branching off from the reception line, and a photocoupler PC having an input side connected to the lead-in wires and having an output side insulated from the lead-in wires. The break detection unit 6 also includes a current limiting resistor RS connected in parallel with the terminating resistor RP, a pull-up resistor RF connected to a power source VCC and an output side of the photocoupler PC, and a capacitor Ca used to eliminate glitches caused by an output delay of the photocoupler PC.

The break detection unit 6 is applied to a motor control system. Referring to FIGS. 1 and 3, when a line drive 1 outputs signals through three channels CH1 to CH3, the break detection unit 6 is provided for each reception line to detect a break of one of the reception lines.

The photocoupler PC, for instance a bi-directional photocoupler, may detect the break of one or two lead-in wires when two lead-in wire voltages IN+ and IN− are normally inputted and a current flows in a normal direction, or when the two lead-in wire voltages IN+ and IN− are inputted in reverse and a current flows in the reverse direction. In the photocoupler PC, two photodiodes are connected to the input side of the photocoupler PC to be connected in parallel with each other and a phototransistor is connected to the output side to be switched according to an output of the photodiodes.

The current limiting resistor RS functions to properly limit the current inputted through the lead-in wires. The terminating resistor RP is a pure resistor used to lead the current flow to the lead-in wires. In this case, the line voltage of the reception line, that is, a voltage difference between the two lead-in wire voltages IN+ and IN−, is determined as being normal if it is higher than a reference voltage 0.6 V. The operating voltage of the photocoupler PC is 1.0 V higher than the reference voltage 0.6 V, so the resistance values of the current limiting resistor RS and the terminating resistor RP are set with the operating voltage of the photocoupler PC taken into consideration.

There is hereinafter described an operation in which the break detection unit 6 detects the break of the reception line according to the line voltage of the reception line.

First, when the lead-in wire voltages IN+ and IN− are normally formed, that is, the lead-in wire voltage IN+ is 3.5 V and the lead-in wire voltage IN− is 0 V, a signal being transmitted through the reception line passes through the current limiting resistor RS and enters a positive input side of the photocoupler PC, that is, a forward photodiode. As a result, the phototransistor is operated, so a high level signal is outputted to the OR gate 5.

Second, when the lead-in wire voltages are formed in reverse, that is, the lead-in wire voltage IN+ is 0 V and the lead-in wire voltage IN− is 3.5 V, the signal being transmitted through the reception line passes through a negative input side of the photocoupler, that is, a backward photodiode, and enters the current limiting resistor RS. As a result, the phototransistor is operated so that the high level signal is outputted to the OR gate 5.

Third, when any of two strands of the reception line is broken and, accordingly, the current does not flow through the lead-in wires, the line voltage is lower than the reference voltage 0.6 V and the photocoupler PC is not operated and the break detection unit 6 outputs the error signal FAULT. That is, a low level signal is outputted to the OR gate 5, so that a receiver controller recognizes the break of the reception line.

Meanwhile, while the photocoupler PC outputs the high or low level signal, depending on whether the reception line is broken or not, glitches caused by the output delay of the photocoupler PC are eliminated by the capacitor Ca.

As described above, the reception line break detection apparatus of the present invention detects a break of a reception line using a current limiting resistor, a terminating resistor, and a photocoupler, reducing a number of component parts of the apparatus and the apparatus can be easily insulated because of fewer power sources VCC and GND required. Additionally, glitches caused by the output delay of the photocoupler operating to detect the break of the reception line are eliminated by a capacitor, thus, reliability of the detection operation of the apparatus does not deteriorate.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A reception line break detection apparatus, comprising:
   a transmission-side line drive;
   a reception line;
   a switching element;
   a reception-side line receiver receiving signals transmitted from the transmission-side line drive through the reception line; and
   a break detection unit detecting a break of the reception line to electrically couple the transmission-side line drive to the reception-side line receiver using the switching element, wherein the switching element is switched according to a line voltage of lead-in wires branched off from the reception line.

2. The reception line break detection apparatus according to claim 1, wherein the break detection unit comprises:
   a terminating resistor connected in parallel with the lead-in wires; and
   a current limiting resistor connected in series between the lead-in wires and an input side of the switching element.

3. The reception line break detection apparatus according to claim 1, wherein the switching element comprises a photocoupler having an input side connected to the lead-in wires and an output side insulated from the lead-in wires.

4. The reception line break detection apparatus according to claim 3, wherein the photocoupler comprises forward and backward diodes, which are connected in parallel with each other so as to detect the break of the reception line when the line voltage of the lead-in wires is formed normally or in reverse and the line voltage is lower than a reference voltage.

5. The reception line break detection apparatus according to claim 3, further comprising:
   a capacitor connected to the output side of the photocoupler to eliminate glitches caused by an output delay of the photocoupler.

6. A reception line break detection apparatus transmitting and receiving data, comprising:
   a transmission-side line drive transmitting signals;
   a reception-side line receiver receiving the signals;
   a reception line electrically coupling the transmission-side line drive to the reception-side line receiver; and
   a break detection unit comprising
      an input side connected to the reception line and an output side insulated from the reception line,
      a switching element comprising an input side connected to lead-in wires branching off from the reception line and comprising an output side insulated from the lead-in wires,
      a terminating resistor connected across the lead-in wires,
      a current limiting resistor connected in parallel with the terminating resistor RP limiting current inputted through the lead-in wires,
      a pull-up resistor connected to a single power source and the output side of the photocoupler, and
   a capacitor connected to the output side of the switching element eliminating glitches caused by an output delay of the switching element, wherein the break detection unit detects a line break of the reception line when a line voltage of the reception line is lower than a reference voltage and outputs an error signal indicative thereof.

7. The reception line break detection apparatus according to claim 6, wherein the switching element comprises:
   two photodiodes connected to the input side of the switching element, connected in parallel with each other; and
   a phototransistor connected to the output side of the switching element to be switched according to an output of the photodiodes.

8. The reception line break detection apparatus according to claim 6, wherein the switching element detects the line break of the lead-in wires when lead-in wire voltages IN+ and IN− are normally inputted, respectively, and a current flows in a normal direction, or when the lead-in wires voltages IN+ and IN− are inputted in reverse and the current flows in the reverse direction.

9. The reception line break detection apparatus according to claim 8, wherein the line voltage of the reception line comprises a voltage difference between the lead-in wire voltages IN+ and IN−.

10. The reception line break detection apparatus according to claim 9, wherein, when the lead-in wire voltages IN+ and IN− are normally formed, a signal being transmitted through the reception line passes through the current limiting resistor and enters the input side of the switching element comprising a forward photodiode.

11. The reception line break detection apparatus according to claim 10, the switching element further comprising a backward photodiode, wherein, when the lead-in wire voltages IN+ and IN− are formed in reverse, the signal being transmitted through the reception line passes through the input side of the backward photodiode and enters the current limiting resistor.

12. The reception line break detection apparatus according to claim 6, wherein the switching element further comprises a photocoupler.

13. The reception line break detection apparatus according to claim 6, further comprising:
   a logic gate receiving the error signal from the break detection unit and outputting a break detection signal indicative of an occurrence of a line break on a reception side.

* * * * *